United States Patent
Inoue et al.

(10) Patent No.: US 10,639,747 B2
(45) Date of Patent: May 5, 2020

(54) METHOD OF MANUFACTURING LIGHT EMITTING ELEMENT

(71) Applicant: NICHIA CORPORATION, Anan-shi, Tokushima (JP)

(72) Inventors: Naoto Inoue, Anan (JP); Yoshitaka Sumitomo, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 116 days.

(21) Appl. No.: 15/879,333

(22) Filed: Jan. 24, 2018

(65) Prior Publication Data

US 2018/0212100 A1 Jul. 26, 2018

(30) Foreign Application Priority Data

Jan. 26, 2017 (JP) ................................ 2017-012028

(51) Int. Cl.
*B23K 26/53* (2014.01)
*H01L 33/00* (2010.01)
*H01L 21/78* (2006.01)

(52) U.S. Cl.
CPC .............. *B23K 26/53* (2015.10); *H01L 21/78* (2013.01); *H01L 33/0095* (2013.01)

(58) Field of Classification Search
CPC ............ B23K 26/009; B23K 26/50–57; H01L 21/78–786
See application file for complete search history.

(56) References Cited

U.S. PATENT DOCUMENTS

| | | | |
|---|---|---|---|
| 7,897,488 B2 * | 3/2011 | Watanabe | ............... H01L 21/78 438/463 |
| 2005/0186760 A1 | 8/2005 | Hashimura et al. | |
| 2006/0220183 A1 * | 10/2006 | Asai | .................. H01L 21/67132 257/622 |
| 2010/0148315 A1 | 6/2010 | Kumakawa et al. | |
| 2012/0235204 A1 | 9/2012 | Hodota et al. | |
| 2012/0292642 A1 | 11/2012 | Urata et al. | |
| 2013/0023076 A1 | 2/2013 | Uchiyama | |
| 2014/0203318 A1 | 7/2014 | Matsui et al. | |

(Continued)

FOREIGN PATENT DOCUMENTS

| | | |
|---|---|---|
| EP | 1 811 551 A1 | 7/2007 |
| JP | 2004-031526 A | 1/2004 |
| JP | 2004-165227 A | 6/2004 |

(Continued)

*Primary Examiner* — William F Kraig
*Assistant Examiner* — Sun Mi Kim King
(74) *Attorney, Agent, or Firm* — Foley & Lardner LLP

(57) ABSTRACT

A method of manufacturing a light emitting element includes: providing a wafer that includes a substrate having a first principal face and a second principal face, a dielectric multilayer film disposed on the first principal face, and a semiconductor structure disposed on the second principal face; forming modified regions in the substrate by focusing a laser beam inside the substrate via the dielectric multilayer film, and allowing cracks to form from the modified regions to the dielectric multilayer film; subsequent to forming the modified regions in the substrate, removing regions of the dielectric multilayer film that contain cracks; and cleaving the wafer along regions where cracks were formed in the substrate.

20 Claims, 7 Drawing Sheets

(56) References Cited

U.S. PATENT DOCUMENTS

2015/0372188 A1    12/2015   Minakuchi et al.
2016/0270151 A1     9/2016   Morikazu et al.

FOREIGN PATENT DOCUMENTS

| | | |
|---|---|---|
| JP | 2005-191551 A | 7/2005 |
| JP | 2011-243874 A | 12/2011 |
| JP | 2013-042119 A | 2/2012 |
| JP | 2013-165186 A | 8/2013 |
| JP | 2014-107485 A | 6/2014 |
| JP | 2014-139997 A | 7/2014 |
| JP | 2016-004951 A | 1/2016 |
| JP | 2016-167552 A | 6/2016 |
| WO | WO-2011-071100 A1 | 6/2011 |
| WO | WO-2011/090024 A1 | 7/2011 |

* cited by examiner

METHOD OF MANUFACTURING LIGHT EMITTING ELEMENT

CROSS-REFERENCE TO RELATED APPLICATION

This application claims priority to Japanese Patent Application No. 2017-012028, filed on Jan. 26, 2017, the disclosure of which is hereby incorporated by reference in its entirety.

BACKGROUND

The present disclosure relates to a light emitting element.

Semiconductor light emitting elements represented by light emitting diodes (LEDs) are widely utilized. In manufacturing a light emitting diode, the method described below is generally employed. A semiconductor structure is formed on a principal face of a substrate by growing semiconductor layers, patterning the semiconductor layers, forming electrodes, and the like. For the sake of convenience, the structural body in which a semiconductor structure is formed on a principal face of the substrate is occasionally referred to as a "wafer" herein. By dividing the wafer which has a semiconductor structure, multiple chips each having a light emitting structural unit can be obtained.

PCT Publication No. WO 2011/090024 and Japanese Patent Publication Nos. 2014-107485 and 2013-165186 each disclose a method of manufacturing a semiconductor light emitting element that employs a sapphire substrate for the substrate on which semiconductor layers are grown. The techniques disclosed in these patent publications form modified regions in the sapphire substrate employed as the semiconductor growth substrate by focusing a laser beam on the interior of the substrate, followed by cleaving the wafer, for example, by radially extending the tape that supports the wafer. It is known that, when creating a modified region in a substrate, a crack forms in the substrate from the modified region as the starting point. Cleaving of a wafer is accomplished by utilizing such a crack.

SUMMARY

There is a need to improve the production yield in the manufacturing methods that utilize cleaving of a wafer.

The method of manufacturing a light emitting element according to one embodiment of the present disclosure includes providing a wafer which includes a substrate having a first principal face and a second principal face, a dielectric multilayer film disposed on the first principal face, and a semiconductor structure disposed on the second principal face (step A); forming modified regions in the substrate by focusing a laser beam inside the substrate via the dielectric multilayer film, and allowing cracks to generate from the modified regions to the dielectric multilayer film (step B); subsequent to the step B, removing regions containing the cracks in the dielectric multilayer film (step C); and cleaving the wafer on regions where the cracks formed (step D).

According to certain embodiments of the present disclosure, the light emitting element production yield can be improved.

DETAILED DESCRIPTION

Figure 1:
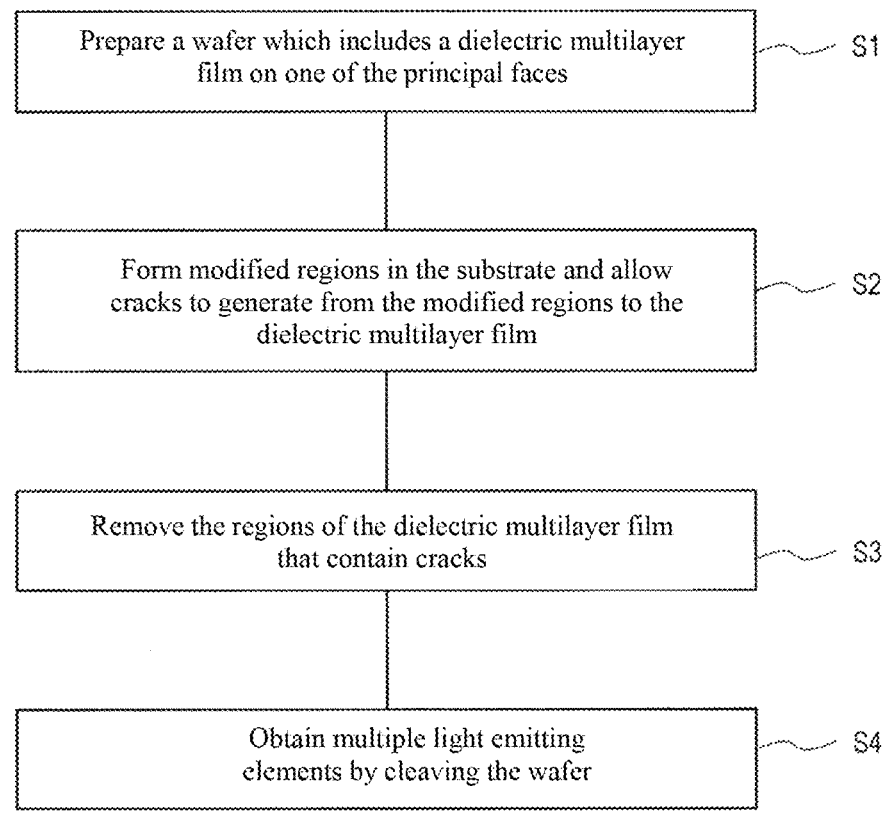
FIG. 1 is a flowchart for explaining an exemplary method of manufacturing a light emitting element according to one embodiment of the present disclosure.

Before explaining certain embodiments of the present invention, the problems found and addressed by the present inventors will be explained.

In manufacturing a light emitting element, a wafer provided with a reflective film on the surface of the substrate opposite the surface where semiconductor layers are disposed is occasionally used. The reflective film includes, for example, a dielectric multilayer film. The dielectric multilayer film disposed on the wafer can reflect light towards the face that opposes the surface that has the semiconductor layers in a light emitting element obtained by cleaving the wafer, thereby achieving the effect of increasing light extraction efficiency.

In cleaving a wafer by using modified regions formed by laser beam irradiation, it may be desirable to irradiate the wafer with a laser beam from the side of the substrate that is opposite the face where semiconductor layers are disposed so that the laser beam does not damage the semiconductor layers or the like that are involved in light emission. The present inventors discovered that, when using a wafer provided with a dielectric multilayer film on the principal face of the substrate opposing the face on which semiconductor layers are disposed, it is possible to generate modified regions in the substrate of the wafer provided with a dielectric multilayer film by irradiating a laser beam via the dielectric multilayer film, and it is thus possible to cleave the wafer.

According to the studies conducted by the present inventors, however, simply forming modified regions in the substrate by irradiating a laser beam via a dielectric multilayer film and cleaving the wafer can render the part of the dielectric multilayer film located on the periphery of each divided piece (hereinafter also referred to as a "die/dice") vulnerable to chipping which will likely reduce the yield. Presumably, such chipping of the dielectric multilayer film on the periphery of a die is caused by the inconsistency between the direction of cracks extending in the substrate and the direction of cracks extending inside the dielectric film after reaching the dielectric multilayer film, which is attributable to the difference in the crystal structures between the substrate and the dielectric multilayer film. Cleaving the wafer having cracks in this condition occasionally allows the dielectric multilayer film to be cleaved in an unintended direction, thereby chipping the dielectric multilayer film on the periphery of the dice. Chipping of dielectric multilayer film occurring on the periphery of a die can cause a decline in the light extraction efficiency of the light emitting element. This can also cause the yield to decline.

In view of the findings described above, the present inventors conducted further studies to develop the present invention.

Certain embodiments of the present disclosure will be explained in detail below with reference to the accompanying drawings. The embodiments described below are illustrations of examples, and the method of manufacturing a light emitting element according to the present disclosure is not limited to these embodiments. For example, the numerical values, shapes, materials, steps, the order of the steps, and the like are merely provided as examples, and can be varied as long as they are not technically inconsistent.

In the explanations below, terms indicating specific directions or positions (for example, "upper," "lower," "right," "left," or other terms including these) are occasionally used. These terms are merely used for the purpose of making the relative direction or position of the disclosure easily understood based on the drawings being referred to. The layout of the components in an actual product or the like does not have to be identical with the absolute layout specified by the terms such as "upper," "lower," or the like, relative to a certain reference, as long as the relative positions of the components have the same relationship as that represented by terms, such as "upper," "lower," or the like, in a certain drawing being referred to, for example. The sizes of the components, their positional relationship, or the like, shown in the drawings might be exaggerated for clarity of explanation, and might not precisely reflect the magnitude relation between the constituent elements in the actual wafer, light emitting element, or the like. In the present disclosure, moreover, "parallel" and "perpendicular" (or "orthogonal"), unless otherwise specifically noted, are not limited to those situations where the angle formed by two lines, sides, planes, or the like is perfectly 0° and 90°, respectively, and the angles can work as long as they are substantially 0° and 90°, respectively.

FIG. 1 is a flowchart for explaining an example of the method of manufacturing a light emitting element according to one embodiment of the present disclosure. As shown in FIG. 1, the method of manufacturing a light emitting element according to the embodiment of the disclosure briefly includes: providing a wafer which includes a substrate including a dielectric multilayer film on one principal face thereof; forming modified regions in the substrate and allowing cracks to form from the modified regions to the dielectric multilayer film; removing the regions containing cracks in the dielectric multilayer film; and obtaining multiple light emitting elements by cleaving the wafer.

Embodiment 1

Figure 2:
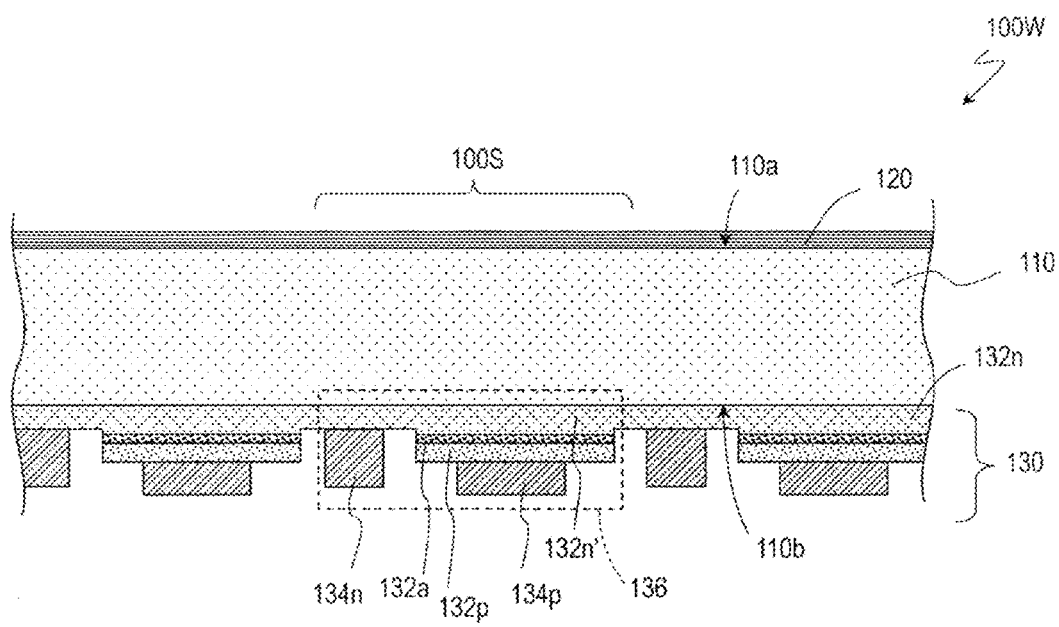
FIG. 2 is a schematic cross-sectional view of a portion of a wafer 100W before cleaving.

FIG. 2 schematically shows a cross section of one portion of the wafer before cleaving. The wafer 100W shown in FIG. 2 includes a substrate which has a first principal face 110a and a second principal face 110b located on the opposite side of the first principal face 110a; a dielectric multilayer film 120 on the first principal face 110a, and a semiconductor structure 130 formed on the second principal face 110b.

For the substrate 110, a substrate capable of growing semiconductor layers of the semiconductor structure 130 described later can be selected. In the following, an example in which a sapphire substrate is used as the substrate 110 will be explained. As described later, for the substrate 110 here, a c-plane sapphire substrate is employed in which the second principal face 110b is c-plane expressed as (0001) based on Mirror indices. The c-plane sapphire substrate here includes those that have a slanted second principal face 110b forming an off-axis angle of 5° at most with c-plane. The thickness of the sapphire substrate can be set to, for example, about 50 µm to about 2 mm. Alternatively, a sapphire substrate having about 200 µm to about 2 mm thickness may be provided, followed by reducing the thickness by polishing or the like after forming the semiconductor structure 130 to a range of from about 50 µm to about 400 µm or about 100 µm to about 300 µm.

The semiconductor structure 130 includes an n-type semiconductor layer 132n directly or indirectly covering the entire surface of the second principal face 110b of the substrate 110, an active layer 132a disposed in predetermined multiple regions on the n-type semiconductor layer 132n, a p-type semiconductor layer 132p disposed on each active layer 132a, multiple p-side electrodes 134p disposed on each p-type semiconductor layer 132p, and multiple n-side electrodes 134n disposed on the n-type semiconductor layer 132n. The semiconductor structure 130 may further include an insulating protective film.

The wafer 100W includes repeated rows of unit regions 100S each including a light emitting structural unit 136. Although FIG. 2 shows three unit regions 100S arranged laterally when viewed on the figure, the unit regions 100S are generally arranged in a direction perpendicular to the plane figure in addition to the direction shown in FIG. 2. Each light emitting structural unit 136 includes an n-type semiconductor layer 132n', which is part of the n-type semiconductor layer 132n of the semiconductor structure 130; an active layer 132a positioned on the n-type semiconductor layer 132n'; a p-type semiconductor layer 132p on the active layer 132a; a p-side electrode 134p on the p-type semiconductor layer 132p; and an n-side electrode 134n on the n-type semiconductor layer 132n'. The light emitting structural unit 136 corresponds to the portion of a die obtained by cleaving the wafer 100W which excludes the substrate and the dielectric multilayer film, in other words, the structure that includes the semiconductor and electrode portions. In the following, the regions located between the p-type semiconductor layers 132p of two adjacent light emitting structural units 136 in a plan view will occasionally be referred to as streets in the pattern made up of the light emitting structural units 136.

The n-type semiconductor layer 132n', the active layer 132a, and the p-type semiconductor layer 132p of each light emitting structural unit 136 is a nitride semiconductor layer, such as $In_XAl_YGa_{1-X-Y}N$ (0≤X, 0≤Y, X+Y<1) or the like. The n-type semiconductor layer 132n', the active layer 132a, and the p-type semiconductor layer 132p of each light emitting structural unit 136 may alternatively be a semiconductor layer, such as an InGaAs-based semiconductor, GaP-based semiconductor, or the like. No restrictions apply to selection of the method of growing the semiconductor layers, and metal organic chemical vapor deposition (also known as MOCVD or MOVPE), halide vapor phase epitaxy, or the like, can be used. Use of MOCVD can realize a semiconductor layer having good crystallinity.

Each light emitting structural unit 136 emits light as electric current is supplied between the p-side electrode 134p and the n-side electrode 134n in a die obtained by cleaving the wafer 100W. The light emitted from the light emitting structural unit 136 is primarily extracted from the side of the light emitting structural unit 136 on which the p-side electrode 134p and the n-side electrode 134n are formed. The peak wavelength of the light emitted by the active layer 132a is, for example, in the range of from 360 nm to 650 nm.

The dielectric multilayer film 120 on the first principal face 110a is configured with multiple dielectric layers, functioning as a reflective film that reflects the light from a light emitting structural unit 136 (typically light at the peak wavelength). Examples of the dielectric multilayer film 120 include two or more selected from the group consisting of $SiO_2$, $TiO_2$, and $Nb_2O_5$ films. The number of dielectric layers, the thickness of each layer, and the material included in the dielectric multilayer film 120 can be suitably set depending on the wavelength of the light to be reflected. The luminance of the light emitting element ultimately achieved can be increased by employing a design which uses two or more selected from the group consisting of $SiO_2$, $TiO_2$, and $Nb_2O_5$ films for the dielectric multilayer film 120 in such a manner as to particularly reflect light at the peak wavelength among light emitted by the active layer 132a.

Figure 3:
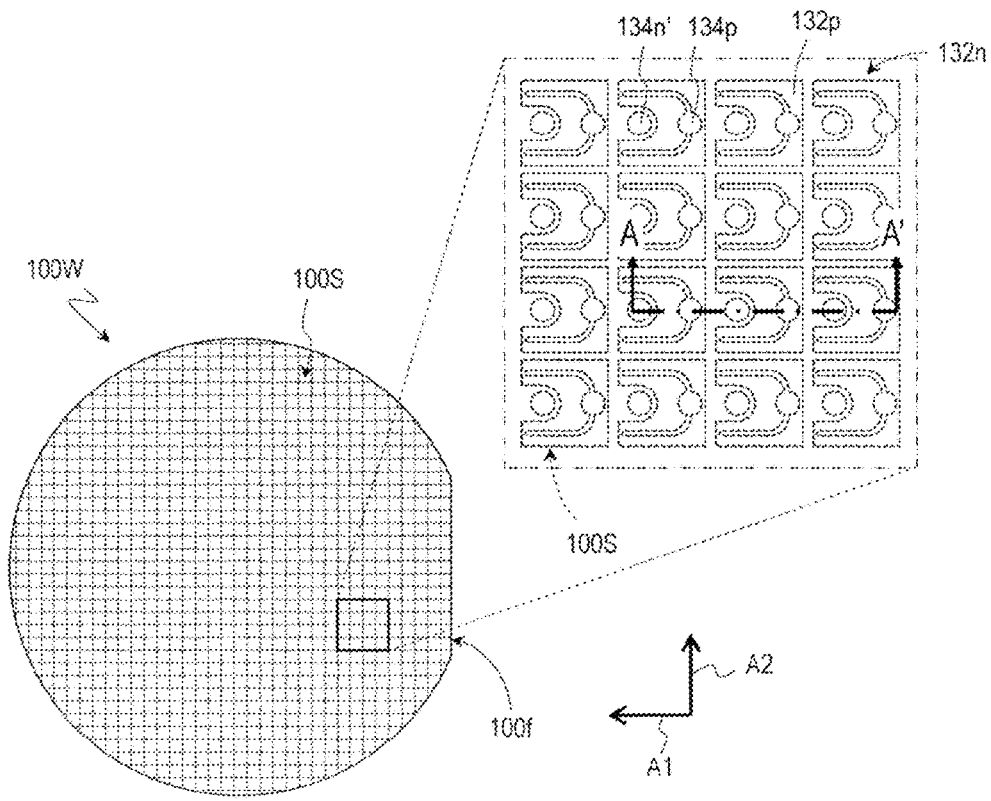
FIG. 3 is a plan view of the wafer 100W showing the side of the dielectric multilayer film 120 when viewed perpendicularly to the first principal face 110a of the substrate 110.

FIG. 3 contains a plan view of the wafer 100W on the side of the dielectric multilayer film 120 when viewed perpendicularly to the first principal face 110a of the substrate 110, and an enlarged view of a portion of the wafer 100W. FIG. 2 is a cross-sectional view taken along line A-A' in FIG. 3. As shown in FIG. 3, on the wafer 100W, multiple unit regions 100S are two-dimensionally arranged. In other words, the light emitting structural units 136 are arranged in two dimensions on the second principal surface 110b. The wafer 100W can include, for example, about 3000 to 50000 unit regions 100S. Multiple light emitting elements can be obtained by cleaving the wafer 100W into individual unit regions 100S.

In the construction illustrated in FIG. 3, the unit regions 100S are arranged in a matrix along a first direction perpendicular to the orientation flat 100f and a second direction in parallel to the orientation flat 100f of the wafer 100W. Accordingly, the light emitting structural units 136 are also arranged in a matrix along the first and second directions. Here, a sapphire substrate whose second principal face 110b is c-plane is used for the substrate 110, and the first direction indicated by arrow A1 in FIG. 3 is parallel to the a-axis of the substrate 110 while the second direction indicated by arrow A2 in FIG. 3 is parallel to the m-axis of the substrate 110.

After providing a wafer 100W, the wafer 100W is set, for example, in a laser dicing apparatus, and modified regions are formed in the substrate 100, i.e., stealth dicing is performed. In general, the wafer 100W is set in the laser dicing apparatus by being secured to a ring frame using the dicing tape attached thereto.

Figure 4:
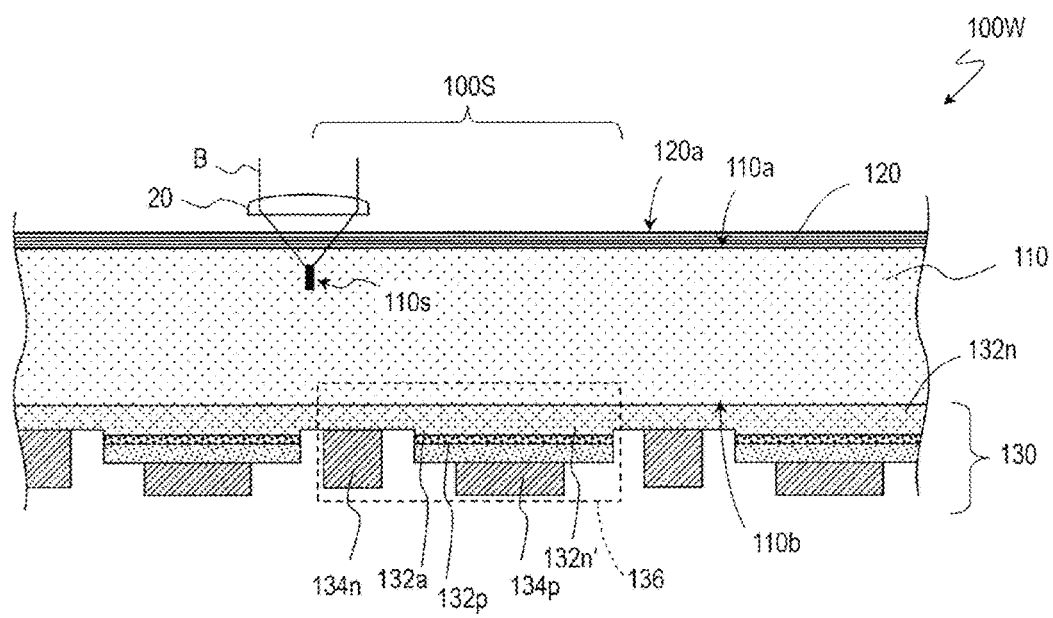
FIG. 4 is a schematic cross-sectional view of the wafer 100W being irradiated with a laser beam.

FIG. 4 shows a wafer 100W being irradiated with a laser beam. As schematically shown in FIG. 4, the modified regions 110s are locally formed inside the substrate 110 by allowing the laser beam B to pass through the condenser lens 20 of the laser dicing apparatus and focused inside the substrate 110. Here, a pulsed laser is repeatedly irradiated to the interior of the substrate 110 through the dielectric multilayer film 120 while changing the irradiation positions along the streets in the light emitting structural unit 136 pattern. Typically, laser beam scanning is performed along the lines where the wafer should be divided (i.e., virtual division lines), for example, along the center of the streets, by repeating pulsed laser irradiation while moving the wafer 100W in the plane parallel to the principal faces of the substrate 110 along the first direction and the second direction. By repeating pulsed laser irradiation along the virtual division lines, multiple modified regions 110s are formed in the substrate 110 along the virtual division lines. Here, pulsed laser scanning is performed along each of the multiple streets being parallel to the first direction and along each of the multiple streets being parallel to the second direction. By performing the laser irradiation as many times as the number of streets, a group of modified regions 110s lined up along the first direction can be formed for each street that is parallel to the first direction, and a group of modified regions 110s lined up along the second direction can be formed for each street that is parallel to the second direction.

In an embodiment of the present invention, the beam B is irradiated from the surface 120a side of the dielectric multilayer film 120 towards the interior of the substrate 110 via the dielectric multilayer film 120 to be focused inside the substrate 110. In terms of the peak wavelength of the laser beam, the wavelength is selected so that the light transmits through the dielectric multilayer film 120 and the substrate 110. For example, a laser beam having a peak wavelength in the range of from 800 nm to 1200 nm can be used.

For the laser source, one that allows for multiphoton absorption, such as a laser capable of generating a pulsed laser, a continuous wave laser, or the like can be used. Here, a laser source capable of generating a pulsed laser, such as a femtosecond laser, picosecond laser, or the like is used. For the laser source, a Ti:sapphire laser, Nd:YAG laser, Nd:YVO4 laser, Nd:YLF laser, or the like can be used.

Alignment in stealth dicing can be achieved, for example, by capturing the image of the wafer 100W from the surface 120a side of the dielectric multilayer film 120 using a camera installed in the laser dicing apparatus, and detecting patterns of the light emitting structural unit 136 from the captured image.

Stealth dicing process conditions according to one example are listed below. The wafer 100W feed speed and the pulse frequency can be suitably adjusted so that the modified region 110s intervals range of from about 2 μm to about 15 μm. A number of modified regions may be formed along the direction normal to the first principal face 110a of the substrate 110 by changing the laser beam focusing positions.

Laser beam's peak wavelength: 1045 nm
Laser output: about 0.1 W to 2.0 W
Pulse width: 1000 femtoseconds
Frequency: 100 kHz
Feed speed: 400 mm/s
Defocus: −20 μm Here, the defocus value is negative on the substrate 110 side and positive on the dielectric multilayer film 120 side, using the position of the first principal face 110a of the substrate 110 as a reference.

The defocus value from the first principal face 110a of the substrate 110 can be suitably set by taking into account the refractive index of sapphire being 1.75 relative to the light having a wavelength of 1045 nm such that the position (i.e., depth) where the laser beam is focused in the direction normal to the first principal face 110a of the substrate 110 is, for example, at least 30 μm from the first principal face 110a of the substrate 110 towards the interior of the substrate 110. In the present embodiment, moreover, even though the substrate 110 is irradiated with a laser beam via the dielectric multilayer film 120, this barely affects the defocus value because the thickness of the dielectric multilayer film 120 is relatively thin, which is in a range of from about 1 μm to 3 μm.

Figure 5:
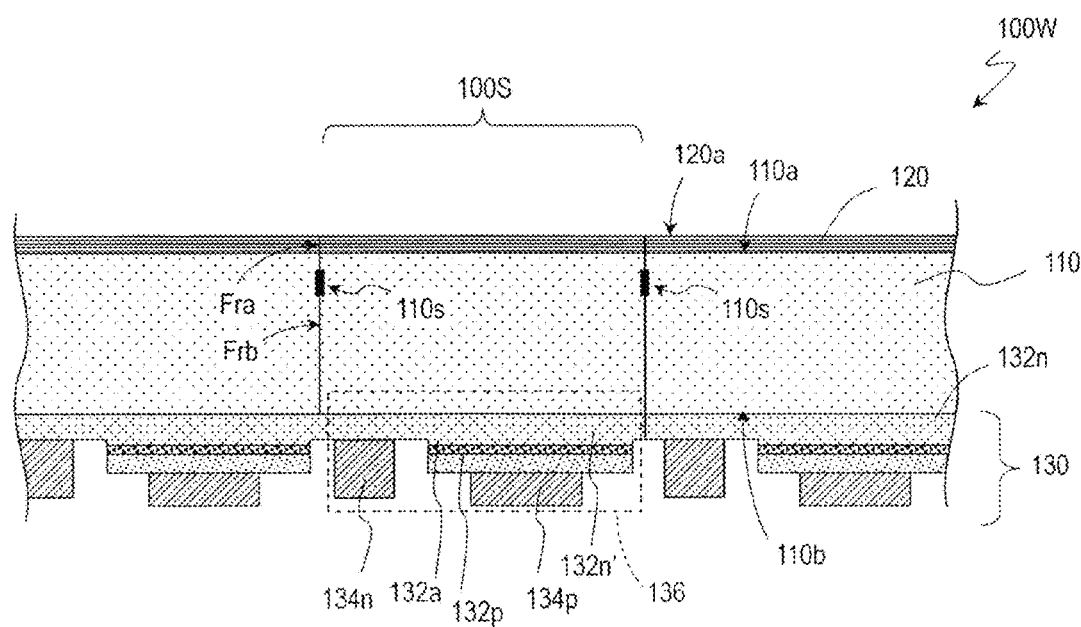
FIG. 5 is a schematic cross-sectional view where cracks Fra have formed as a consequence of forming modified regions 110s.

By forming modified regions 110s in the substrate 110 by focusing the beam B to the interior of the substrate 110, cracks Fra form from the modified regions 110s to the dielectric multilayer film 120 as schematically shown in FIG. 5. According to the findings of the studies conducted by the present inventors, in many cases, cracks are already formed in the dielectric multilayer film 120 by the time the wafer 100W is removed from the laser dicing apparatus without even being subjected to any other process. In other words, it is believed that, typically, at the time stealth dicing is completed, cracks have formed at the first principal face 110a of the substrate 110 and partly in the dielectric multilayer film 120 along the first direction and the second direction as a result of the cracks extending from the modified regions 110s.

Figure 6:
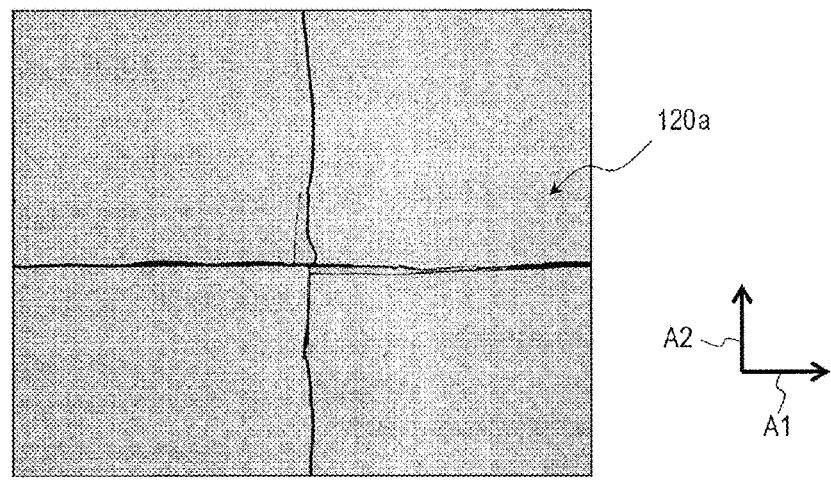
FIG. 6 is a plan view of an example of the cracks formed at the surface 120a of the dielectric multilayer film 120.

FIG. 6 is a photograph of the surface 120a of the dielectric multilayer film 120 captured perpendicularly to the first principal face 110a of the substrate 110, showing the cracks formed at the surface 120a of the dielectric multilayer film 120 as an example. As shown in FIG. 6, following the formation of the modified regions 110s, the cracks Fra starting from the modified regions 110s can ultimately reach the surface 120a of the dielectric multilayer film 120. Although the cracks appearing on the surface 120a of the dielectric multilayer film 120 are wavy to some extent, they are formed substantially along the first direction and the second direction. FIG. 6 shows a portion of the surface 120a of the dielectric multilayer film 120, and it is not essential in the present embodiment of the disclosure for the cracks to be formed in a grid across the entire surface 120a at the completion of stealth dicing. When viewed locally, a crack Fra can possibly cease to extend within the dielectric multilayer film 120 at the completion of stealth dicing. In other words, a crack formed at the surface 120a of the dielectric multilayer film 120 is possibly not continuous from one edge to the other edge of the wafer 100W along the first direction or the second direction. In addition to the cracks Fra, the cracks Frb can also form from the modified regions 110s to extend towards the second principal face 110b of the substrate 110 as schematically shown in FIG. 5.

Subsequently, the regions of the dielectric multilayer film 120 that contain the cracks are removed. For example, the regions of the dielectric multilayer film 120 that contain the cracks are removed along the first direction and the second direction. For example, by partly removing the dielectric multilayer film 120 along the cracks appearing on the surface 120a of the dielectric multilayer film 120, the regions of the dielectric multilayer film 120 that contain the cracks formed at the surface 120a are linearly removed. Even in the case where cracks Fra does not reach the surface 120a of the dielectric multilayer film 120, the cracks Fra inside the dielectric multilayer film 120 can be confirmed by using a microscope or the like. For example, by confirming the locations of the cracks in the dielectric multilayer film 120 from the image of the wafer 100W, the regions that contain the cracks can be removed based on the locations of the cracks inside the dielectric multilayer film 120.

Figure 7:
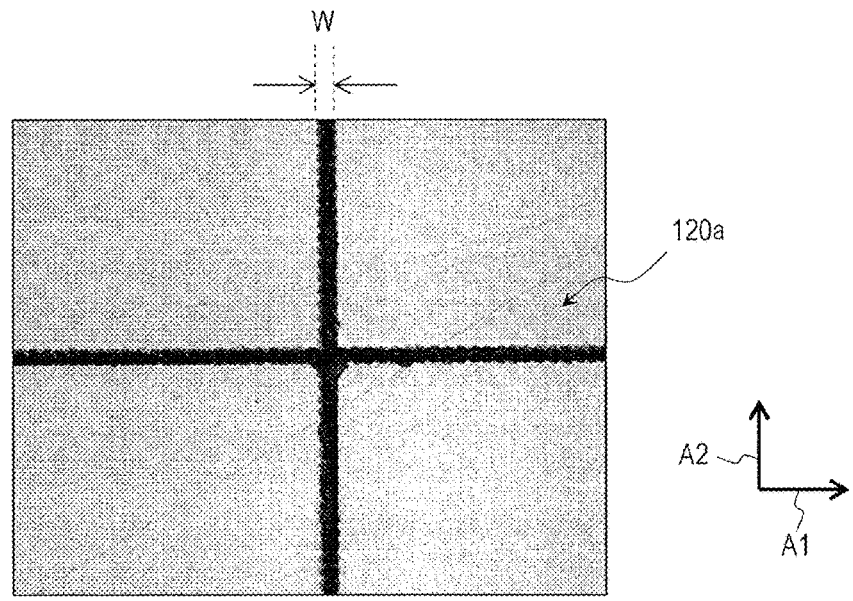
FIG. 7 is a photograph of the surface 120a of the dielectric multilayer film 120 captured in the direction perpendicular to the first principal face 110a of the substrate 110, which is a plan view of an example of the dielectric multilayer film 120 after removing the regions that contained the cracks.

FIG. 7 is a photograph of the surface 120a of the dielectric multilayer film 120 captured perpendicularly to the first principal face 110a of the substrate 110, showing an example of the surface after removing the regions of the dielectric multilayer film 120 that contain the cracks. The width W of the removed portions of the dielectric multilayer film 120 in a top view is preferably in the range of, for example, from about 3 μm to about 15 μm, more preferably in the range of from about 8 μm to about 10 μm. Setting the width W to a predetermined value or higher allows the regions of the dielectric multilayer film 120 that contain the cracks to be removed with a higher degree of certainty. Setting the width W to a predetermined value or lower can reduce the possibility of lowering the light extraction efficiency through an excessive removal of the dielectric multilayer film 120.

It is beneficial if the regions of the dielectric multilayer film 120 removed by this step are smaller than the regions irradiated with the laser beam during the formation of the modified regions 110s when viewed perpendicularly to the first principal face 110a. By making the crack-containing regions to be removed smaller than the laser irradiated regions during the formation of the modified regions 110s, an excessive removal of the dielectric multilayer film 120 can be inhibited or prevented. This thus can prevent a decline of the light extraction efficiency attributable to an excessive removal of the dielectric multilayer film.

If formation of modified regions 110s is to be attempted after partly removing the dielectric multilayer film 120, the laser beam irradiation needs to be applied to the first principal face 110a of the substrate 110 exposed within the regions from which the dielectric multilayer film 120 has been removed such that the laser beam is not refracted at the interface between the dielectric multilayer film 120 and the substrate 110. However, considering the focusing positions of the laser beam and the like, it is difficult to reduce the laser beam spot diameter on the first principal face 110a of the substrate 110. This thus requires larger portions of the dielectric multilayer film 120 to be removed in order to irradiate the laser beam inside the regions from which the dielectric multilayer film 120 has been removed. This consequentially reduces the area of the dielectric multilayer film 120 remaining on the substrate 110 in each light emitting element when the wafer 100W is divided into multiple light emitting elements 100, thereby reducing the light extraction efficiency.

Conversely, in the present embodiment of the disclosure, modified regions 110s are formed before removing the dielectric multilayer film 120. This can inhibit or prevent the portions of the dielectric multilayer film 120 that should remain on the substrate 110 from being removed.

Figure 8:
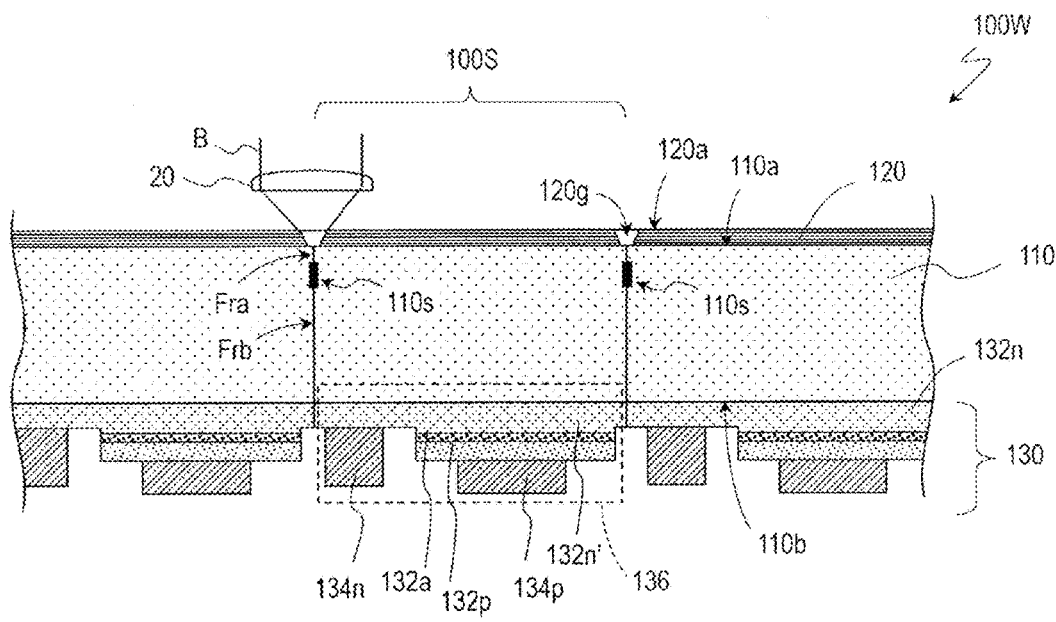
FIG. 8 is a schematic cross-sectional view of an example in which laser beam irradiation is applied to the partial removal of the dielectric multilayer film 120.

For the method of partly removing the dielectric multilayer film 120, so-called half-cut processing, which uses a grinding wheel and a dicing apparatus, may be used, or nanosecond laser irradiation may be applied. As schematically shown in FIG. 8, the dielectric multilayer film 120 is partly removed by laser beam irradiation using the same or a similar technique to that used in forming the modified regions 110s.

By adjustment of the positions at which the laser beam is focused, the dielectric multilayer film 120 can be partly removed by using, for example, the same laser dicing apparatus used in forming the modified regions 110s, thereby forming grooves 120g in the dielectric multilayer film 120 penetrating in a top and bottom direction. Performing the partial removal of the dielectric multilayer film 120 using the same laser dicing apparatus used in forming the modified regions 110s eliminates the necessity of transferring the wafer 100W onto another apparatus, thereby simplifying the manufacturing process. Furthermore, as compared to the cases of employing half-cut processing or nanosecond laser irradiation, a processing failure that could be caused by the grinding wheel coming into contact with the substrate 110 when cutting the dielectric multilayer film 120, or the damage to the wafer 100W that could result from high-output nanosecond laser irradiation can be avoided.

As an example, the process conditions for partly removing the dielectric multilayer film 120 which utilize laser beam irradiation are listed below. The wafer 100W feed speed and the pulse frequency can be suitably adjusted in a similar manner to that in the case of forming modified regions 110s such that the laser beam focusing position intervals range of from about 2 μm to about 15 μm.

Peak wavelength of Laser beam: 1045 nm
Laser output: about 0.1 W to 2.0 W
Pulse width: 1000 femtoseconds
Frequency: 100 kHz
Feed speed: 400 mm/s
Defocus: 0 to 5 μm In partly removing the dielectric multilayer film 120, the laser beam is focused in the vicinity of the interface between the substrate 110 and the dielectric multilayer film 120. The actual focusing positions of laser beam can be any so long as they are in the vicinity of the interface between the substrate 110 and the dielectric multilayer film 120, and a deviation of about ±2 μm in the direction normal to the first principal face 110a of the substrate 110 is tolerable. However, from the standpoint of efficient removal of the dielectric multilayer film 120, it is beneficial to focus the laser beam at positions within the dielectric multilayer film 120 closer to the first principal face 110a of the substrate 110. The laser beam may be irradiated to the same positions multiple times.

As explained with reference to FIG. 6, in this example, the cracks at the surface 120a of the dielectric multilayer film 120 are formed substantially along the first direction and the second direction. Accordingly, the regions containing the cracks in the dielectric multilayer film 120 can be removed by performing laser beam scanning and repeating pulsed laser irradiation, while moving the wafer 100W in the plane parallel to the principal faces of the substrate 110 along the first direction and the second direction in such a manner as to trace the cracks formed inside or on the surface 120a of the dielectric multilayer film 120. Since the positions of the cracks inside or on the surface 120a of the dielectric multilayer film 120 can be confirmed from the surface 120a side of the dielectric multilayer film 120, alignment of the wafer 100W can be relatively easily achieved.

Figure 9:
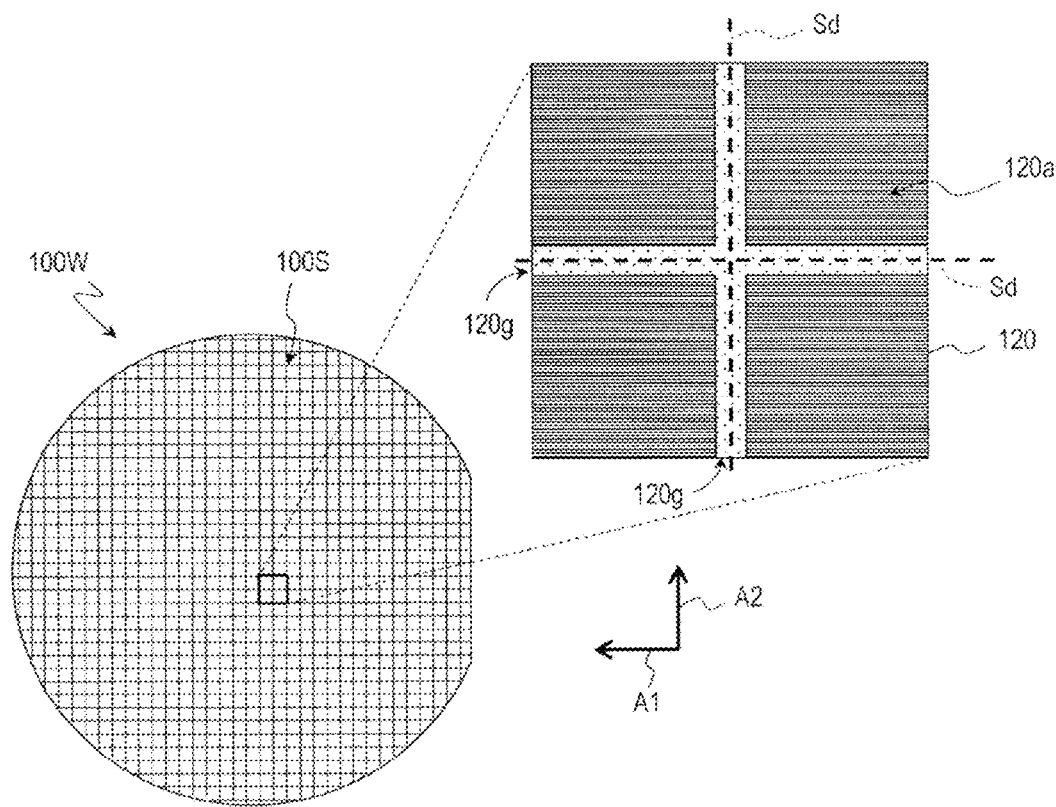
FIG. 9 is a partially enlarged view for explaining an example of the relationship between the grooves 120g formed in the step of partly removing the dielectric multilayer film 120 and the laser beam scan lines in the step of forming modified regions 110s.

FIG. 9 shows an example of the relationship between the grooves 120g formed in the step of partly removing the dielectric multilayer film 120 and the laser beam scan lines in the step of forming the modified regions 110s. For example, by applying the laser beam B along the first direction and the second direction, the grooves 120g are formed in the dielectric multilayer film 120 along the first direction and the second direction, as shown in the enlarged view on the right-hand side of FIG. 9. In this example, the laser beam scan lines for partly removing the dielectric multilayer film 120 are located substantially in the center of the grooves 120g. The broken lines Sd in FIG. 9 indicate the laser beam scan lines for the step of forming modified regions 110s. Accordingly, the modified regions 110s are formed in the substrate 110 along the broken lines Sd. As shown in FIG. 9, here, the broken lines Sd extend along substantially the center of the grooves 120g. In other words, in this example, the laser beam scan lines in the step of partly removing the dielectric multilayer film 120 and the step of forming the modified regions 110s substantially coincide with one another. As can be understood from FIG. 8, in this example, in the step of partly removing the dielectric multilayer film 120, the regions directly above the modified regions 110s in the dielectric multilayer film 120 are removed. As discussed later, however, there are occasions where the laser beam scan lines between the step of partly removing the dielectric multilayer film 120 and the step of forming modified regions 110s do not correspond to each other intentionally in order to obtain a benefit of the yield increase.

Figure 10:
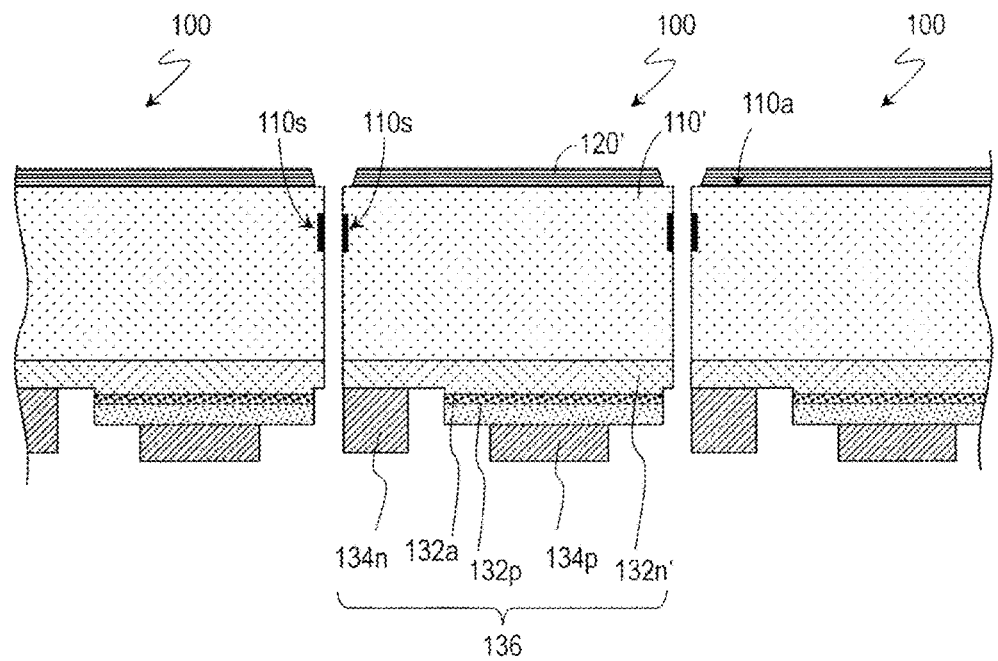
FIG. 10 is a schematic cross-sectional view of the wafer 100W after cleaving.

By radially extending the dicing tape that supports the wafer 100W, the wafer 100W is cleaved along the regions where cracks formed. Alternatively, the wafer 100W can be cleaved along the regions where cracks formed by placing the edge of a plate-shaped blade on a street and pressing the blade against the wafer 100W. By cleaving the wafer 100W, multiple light emitting elements 100 each having a substrate 110', a dielectric multilayer film 120', and a light emitting structural unit 136, as schematically shown in FIG. 10, are obtained. Here, since the wafer 100W is cleaved along the first direction and the second direction, each light emitting element 100 is substantially quadrangular in shape when viewed from top.

As explained above, in the present embodiment, the regions containing the cracks in the dielectric multilayer film 120 that formed as a result of forming the modified regions 110s are removed, and the wafer 100W is subsequently cleaved. Since the regions of the dielectric multilayer film 120 that include, for example, the locations of the cracks are removed first, chipping of the dielectric multilayer film 120 that could otherwise result when the wafer 100W is divided into multiple light emitting elements 100 can be prevented. This thus increases the yield. According to the present embodiment, a light emitting element 100 that has a dielectric multilayer film 120' on the first principal face 110a, which opposes the second principal face 110b of the substrate 110 where the light emitting structural unit 136 is located is obtained. By virtue of the dielectric multilayer film 120' positioned on the first principal face 110a, light leakage from the first principal face 110a side can be reduced, and the decline of the light extraction efficiency is attenuated. As such, according to the present embodiment of the disclosure, a light emitting element 100 with attenuated light extraction efficiency decline can be efficiently provided.

Embodiment 2

A manufacturing method according to Embodiment 2 of the present disclosure will be explained below. In Embodiment 1 described above, the regions of the dielectric multilayer film 120 directly above the modified regions 110s are removed along the first direction and the second direction. As explained below, however, it is possible to achieve a higher yield by removing the regions of the dielectric multilayer film 120 offset by a certain amount from the positions immediately above the modified regions 110s before cleaving the wafer 100W.

Figure 11:
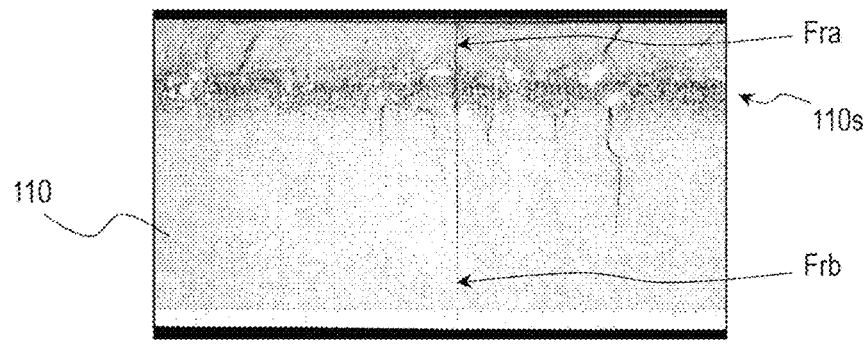
FIG. 11 is a cross-sectional image of the substrate 110 perpendicular to the m-axis after forming modified regions 110s.
Figure 12:
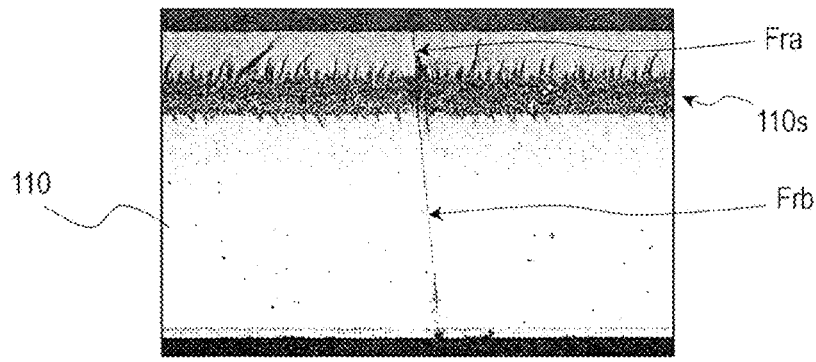
FIG. 12 is a cross-sectional image of the substrate 110 perpendicular to the a-axis after forming modified regions 110s.

FIG. 11 and FIG. 12 are scanning electron microscope (SEM) cross-sectional images after forming the modified regions 110s taken perpendicular to the m-axis and the a-axis of the substrate 110, respectively. In both FIG. 11 and FIG. 12, the first principal face 110a, i.e., the principal face on which the dielectric multilayer film 120 is formed, is located on the upper side of the figures. It can be confirmed from FIG. 11 and FIG. 12 that the multiple modified regions 110s are formed in the substrate 110 laterally on the figures, and the multiple modified regions 110s are consecutively arranged in a strip.

It can be confirmed from FIG. 11 and FIG. 12 that in both cross-sections perpendicular to the maxis and the a-axis of the substrate 110, the cracks Fra extending from the modified regions 110s to the first principal face 110a and cracks Frb extending from the modified regions 110s to the second principal face 110b are formed. Focusing on FIG. 11 which shows the cross section perpendicular to the m-axis of the substrate 110, the crack Fra extends substantially in parallel to the direction normal to the first principal face 110a from the modified regions 110s. Accordingly, if cracks appear in a grid at the surface 120a of the dielectric multilayer film 120, for example, it can be said that those cracks extending in the second direction in parallel to the maxis of the substrate 110 are located in the regions immediately above the modified regions 110s that are formed along the second direction. In other words, when focusing on one street extending along the second direction in parallel to the maxis of the substrate 110, the positions of the cracks among those formed inside and/or at the surface 120a of the dielectric multilayer film 120 that overlap the street substantially coincide with the positions of the cracks among those formed at the first principal face 110a that overlap the street in a top view (or in a cross-sectional view).

In contrast, in the example shown in FIG. 12, the crack Fra is oblique to the direction normal to the substrate 110 in the cross section perpendicular to the a-axis of the substrate 110. Accordingly, the positions of the cracks which extend along the first direction in parallel to the a-axis of the substrate 110 and are formed at the first principal face 110a, are deviated from the regions immediately above the modified regions 110s in a cross-sectional view. As described above, in the cross section perpendicular to the a-axis of the substrate 110, the positions of the cracks formed on the first principal face 110a along the first direction might not coincide with the regions immediately above the modified regions 110s. Accordingly, the cracks extending along the first direction inside and/or at the surface 120a of the dielectric multilayer film 120 can also be located in the regions that deviate in the second direction from the regions immediately above the modified regions 110s formed along the first direction in a top view.

In a cross section perpendicular to the a-axis of the substrate 110, the angle formed between the crack Fra and the direction normal to the first principal face 110a is in a range of from, for example, 3 to 10 degrees. For example, a deviation of about 3 µm to 5 µm can occur between the positions of the cracks at the surface 120a of the dielectric multilayer film 120 extending along the first direction and the positions of the modified regions 110s depending on the distance from the first principal face 110a of the substrate 110 to the modified regions 110s.

In Embodiment 2, in the step of removing the regions of the dielectric multilayer film 120 that contain cracks, in a similar manner to that in Embodiment 1, the regions containing the cracks formed in the dielectric multilayer film 120 are removed along the first direction and the second direction by laser beam scanning. At this time, with regard to the removal of the regions containing the factures extending in the second direction in a top view, the regions of the dielectric multilayer film 120 located immediately above the modified regions 110s formed along the second direction are removed for each street. On the other hand, with regard to the removal of the regions containing the cracks extending along the first direction in a top view, the parts of the dielectric multilayer film 120 shifted in the second direction by a predetermined amount from the regions immediately above the modified regions 110s formed along the first direction are removed for each street. The amount of shift can be suitably set depending on the properties of the substrate 110 used, and the distance (i.e., depth) from the first principal face 110a to the modified regions 110s. The amount of shift can be in the range of from, for example, about 1 µm to about 20 µm.

Figure 13:
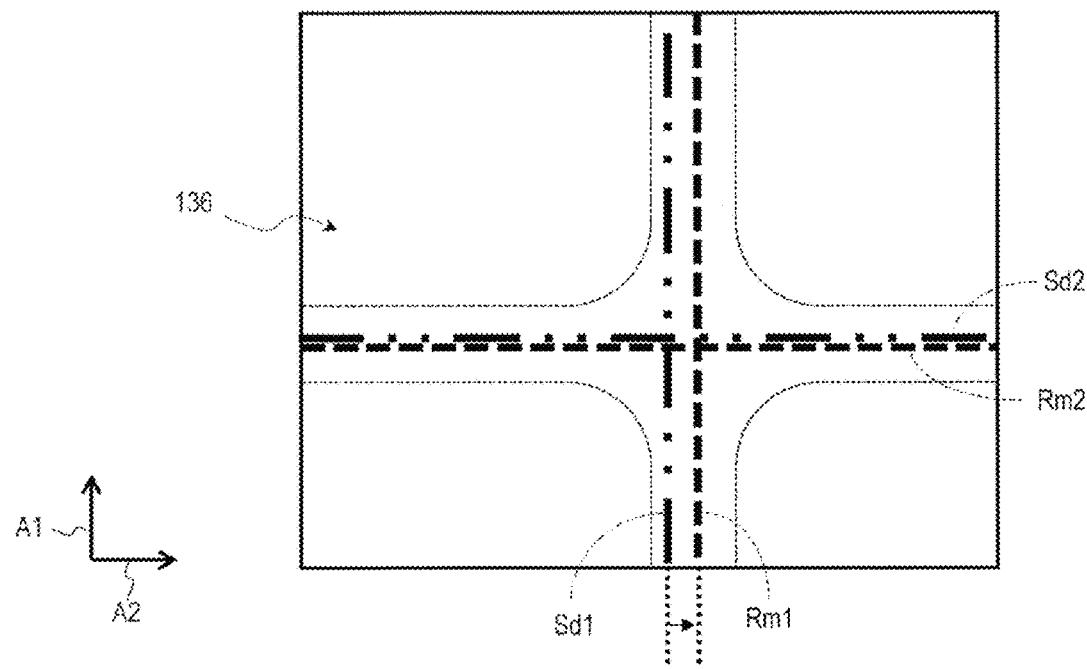
FIG. 13 is a plan view of another example of the relationship between the laser beam scan lines in the step of partly removing the dielectric multilayer film 120 and the laser beam scan lines in the step of forming modified regions 110s.

FIG. 13 shows another example of the relationship between the laser beam scan lines in the step of partly removing the dielectric multilayer film 120 and the laser beam scan lines in the step of forming modified regions 110s. FIG. 13 is an enlarged view of one of intersections of streets extending in the first direction and streets extending in the second direction.

The two-dot chain lines in FIG. 13 indicate laser beam scan lines Sd1 and Sd2 in the step of forming the modified regions 110s. Multiple modified regions 110s are formed in the substrate 110 along the scan line Sd1 and the scan line Sd2.

The bold broken lines in FIG. 13 indicate the laser beam scan lines Rm1 and Rm2 in the step of partly removing the dielectric multilayer film 120. In this embodiment, the scan line Rm2 along the second direction in the step of partly removing the dielectric multilayer film 120 can substantially coincide with the scan line Sd2 along the second direction in the step of forming modified regions 110s. On the other hand, the laser along the first direction in the step of forming modified regions 110s is applied along the scan line Sd1, while the laser along the first direction in the step of partly removing the dielectric multilayer film 120 is applied along the scan line Rm 1 which is shifted in the second direction from the scan line Sd1 by a predetermined amount. The scan line Rm2 and the scan line Sd2 are shown in FIG. 13 as though they do not coincide with each other, but this is because the positions of these lines are slightly shifted on purpose so that they do not overlap in the drawing.

As shown by this example, the crack-containing regions of the dielectric multilayer film 120 extending along the first direction can be removed with a higher degree of certainty by shifting the portions of the dielectric multilayer film 120 to be removed in the second direction by a predetermined amount from the regions immediately above the modified regions 110s. For example, the regions of the dielectric multilayer film 120 that include the locations of the cracks formed at the surface 120a of the dielectric multilayer film 120 can be removed with a higher degree of certainty. Removing the crack-containing regions of the dielectric multilayer film 120 with a higher degree of certainty can reduce the occurrence of chipping of the dielectric multilayer film 120 attributable to dividing of the wafer into multiple light emitting elements 100, thereby enabling the yield increase. In this example, the positions of the scan lines Sd1 are adjusted in such a manner as to be shifted from the center of the streets. As shown by this example, it is beneficial to shift the positions of the scan lines Sd1 from the center of the streets while positioning the scan lines Rm 1, for example, at the center of the streets, by considering the fact that the cracks Fra are oblique to the direction normal to the first principal face 110a in a cross section perpendicular to the a-axis of the substrate 110. In this manner, the cracks formed inside and/or at the surface 120a of the dielectric multilayer film 120 along the first direction can be positioned substantially in the center of the streets, and the grooves 120g can be formed in the substantially center of the streets on the dielectric multilayer film 120. As a result, each of the light emitting elements 100, in which a dielectric multilayer film 120' is formed in the expected region, can be manufactured while reducing the occurrence of chipping of the dielectric multilayer film 120 when cleaving the wafer 100W into multiple light emitting elements 100.

The regions of the dielectric multilayer film 120 that contain the cracks can be readily removed by increasing the regions of the dielectric multilayer film 120 to be removed by enlarging diameter of the laser beam's spot in the step of partly removing the dielectric multilayer film 120, instead of shifting the scan lines Rm1 from the scan lines Sd1 in the second direction by a predetermined amount. From the perspective of improving the light extraction efficiency of the light emitting element 100, however, it is more advantageous to remove the crack-containing regions of the dielectric multilayer film 120 by shifting the scan lines Rm 1 from the scan lines Sd1 in the second direction by a predetermined amount rather than increasing the laser beam's spot diameter, as the former can reduce the removed regions of the dielectric multilayer film 120.

As explained above, according to at least either of the embodiments of the present disclosure, the occurrence of chipping of the dielectric multilayer film 120 attributable to dividing of the wafer into multiple light emitting element 100 can be reduced, and thus the yield can be increased. Focusing only on the point of performing stealth dicing by irradiating a laser beam through the dielectric multilayer film 120, it is not impossible to say that this is a common feature for the technique disclosed in Japanese Patent Publication No. 2014-107485 and certain embodiments of the present invention. In the case of the technique disclosed in Japanese Patent Publication No. 2014-107485, however, grooves are formed in the metal film of the reflective film beforehand, and the laser beam is focused inside the single crystal substrate via the grooves. In order to sufficiently focus the laser beam inside the single crystal substrate using such a method, relatively large width grooves must be formed in the metal film such that the metal film does not interfere with the laser beam irradiation. Accordingly, larger portions of the metal film are removed, resulting in reduction in the light extraction efficiency of the light emitting elements. Furthermore, because the portions of the dielectric multilayer film that contain cracks are not removed, it would be likely for the dielectric multilayer film to be chipped on the periphery in each of the light emitting elements obtained by cleaving the wafer.

On the other hand, in the technique disclosed in Japanese Patent Publication No. 2013-165186, grooves are formed in the reflective film by removing not only the metal film, but also the dielectric multilayer film along the scheduled division lines before performing stealth dicing. When forming the grooves, dicing is performed by employing a grinding wheel. When a grinding wheel is employed in dicing, each groove generally has a curved bottom face in a cross-sectional view. Aberrations attributable to the curved bottom face of a groove can make it difficult to sufficiently focus a laser beam in the single crystal substrate.

Such a problem caused by the aberrations is seemingly avoidable at first glance if the dielectric multilayer film is removed by laser beam irradiation beforehand instead of dicing. If the dielectric multilayer film is removed by laser beam irradiation beforehand, however, the debris of dielectric multilayer film material can scatter or absorb the laser beam during stealth dicing. It is difficult to focus the laser beam in the substrate under such conditions where scattering or absorption can occur. This would require the laser beam to output higher power in order to form modified regions. This, as a result, would likely damage the light emitting structural units to thereby reduce the yield.

As such, the yield is possibly reduced instead of being increased by any technique that merely switches the sequence of the steps of the embodiments of the present invention between the laser beam irradiation for stealth dicing and the laser beam irradiation for partly removing the dielectric multilayer film. This point will be explained below with reference to certain embodiments and comparative examples of the disclosure.

EXAMPLE 1

First, a wafer was provided using a sapphire substrate as the substrate 110, a 21-layer dielectric film formed as the dielectric multilayer film 120 on one principal face of the sapphire substrate, and nitride semiconductor layers formed as the semiconductor structure on the other principal face of the sapphire substrate. Here, a sapphire substrate of 200 µm in thickness was used. For the dielectric multilayer film 120, a multilayer film made by alternately stacking 11 $SiO_2$ layers and 10 $TiO_2$ layers was used. The dielectric multilayer film 120 was optically designed to transmit light having the peak wavelength of the laser beam used in forming modified regions and partly removing the dielectric multilayer film, while reflecting light having the peak wavelength of the light from the semiconductor structure.

Modified regions were formed in the substrate by irradiating the laser beam along the first direction and the second direction from the side of the principal face having the dielectric film formed thereon, which corresponded to the first principal face 110a. This was performed under the process conditions 1 listed below.

"Process Conditions 1"

Laser beam's peak wavelength: about 1000 nm

Pulse energy for scanning along the first direction: 0.4 W

Pulse energy for scanning along the second direction: 0.4 W

Frequency for scanning along the first direction: 100 kHz

Frequency for scanning along the second direction: 100 kHz

Feed rate for scanning along the first direction: 1000 mm/s

Feed rate for scanning along the second direction: 500 mm/s

Defocus: −20 µm

Offset for scanning along the first direction: −10 μm
Offset for scanning along the second direction: 0 μm In stealth dicing, laser beam scanning was performed in the order of the second direction and the first direction. Moreover, the laser beam was irradiated while scanning twice per street in each direction. In other words, laser beam scanning was performed four times per street. Here, the "offset for scanning along the first direction" refers the amount of shifting of the focusing position from the center of each street that extends in the first direction. A minus sign indicates a shift to the left from the center of the street when the wafer is horizontally placed such that the orientation flat coincides with a horizontal direction and positioned near side from the observer. Similarly, the "offset for scanning along the second direction" refers the amount of shifting of the focusing position in the first direction from the center of each street that extends in the second direction.

Subsequently, the dielectric multilayer film was partly removed by irradiating the laser beam from the side of the principal face where the dielectric multilayer film was formed, which corresponded to the first principal face 110a, while scanning along the first direction and the second direction. This was performed under the process conditions 2 listed below.

"Process Conditions 2"
Laser beam's peak wavelength: about 1000 nm
Pulse energy for scanning along the first direction: 0.2 W
Pulse energy for scanning along the second direction: 0.2 W
Frequency for scanning along the first direction: 50 kHz
Frequency for scanning along the second direction: 50 kHz
Feed rate for scanning along the first direction: 600 mm/s
Feed rate for scanning along the second direction: 600 mm/s
Defocus: 2 μm
Offset for scanning along the first direction: −16 μm
Offset for scanning along the second direction: 0 μm Here, laser beam scanning was performed in the order of the second direction and the first direction, and the laser beam was irradiated while scanning once per street in each direction. In other words, laser beam scanning was performed twice per street.

Subsequently, by cleaving the wafer on the regions where cracks were formed using a blade, light emitting elements of Example 1 each having a light emitting structural unit were obtained.

COMPARATIVE EXAMPLE 1

Light emitting elements of Comparative Example 1 were obtained in the same or a similar manner to that in Example 1, except for switching the order between the step of forming modified regions and the step of partly removing the dielectric multilayer film by laser beam irradiation. In other words, in Comparative Example 1, after partly removing the dielectric multilayer film along the streets by laser beam irradiation, formation of modified regions in the substrate was attempted by irradiating the laser beam along the first direction and the second direction from the side of the principal face on which the dielectric multilayer film is formed, which corresponded to the first principal face 110a.

Figure 14:
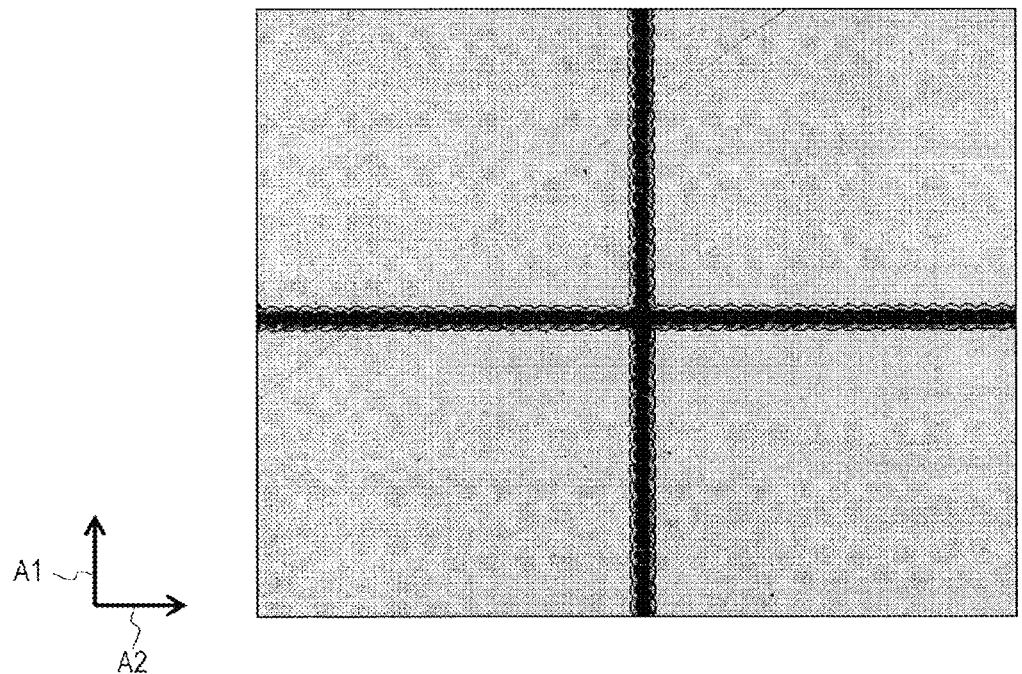
FIG. 14 shows the surface of the dielectric multilayer film of the wafer where the dielectric multilayer film was partly removed by laser beam irradiation applied along the first direction and the second direction prior to forming modified regions in the substrate.
Figure 15:
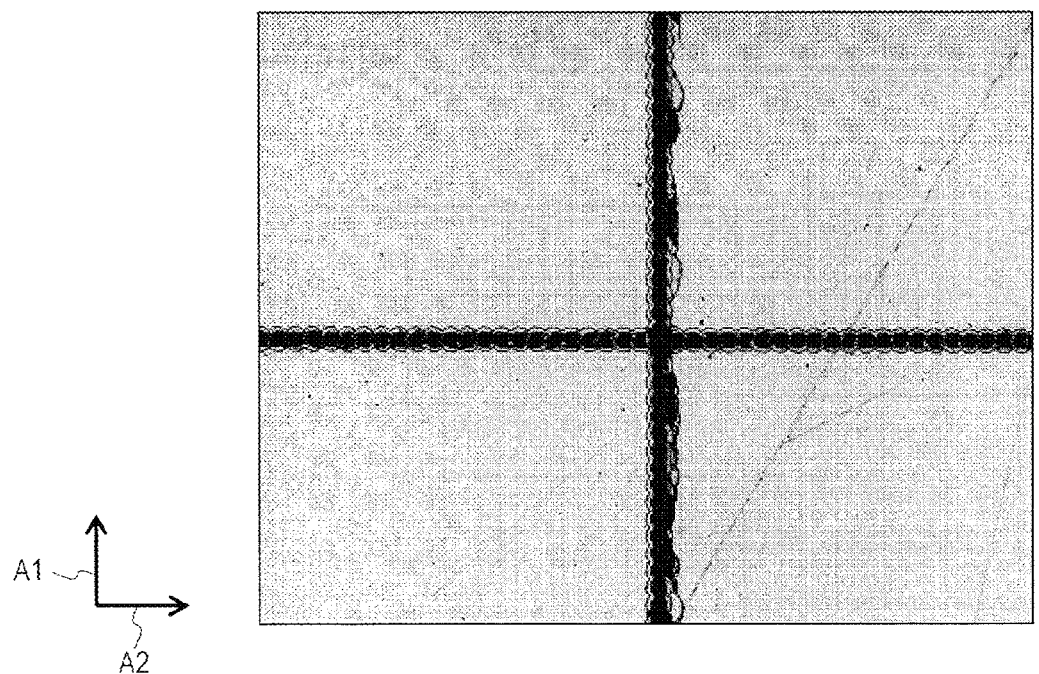
FIG. 15 shows the surface of the dielectric multilayer film of the wafer shown in FIG. 14, which had undergone partial removal of the dielectric multilayer film, after being irradiated with a laser beam for forming modified regions.

FIGS. 14 and 15 explain the method of manufacturing the light emitting elements related to Comparative Example 1. FIG. 14 is a photograph of the dielectric multilayer film surface on the wafer where the dielectric multilayer film was partly removed along the first direction and the second direction by laser beam irradiation prior to forming the modified regions in the substrate. The process conditions used in partly removing the dielectric multilayer film in the samples shown in FIG. 14 were the same as the Process Conditions 2 listed above.

FIG. 15 is a photograph of the dielectric multilayer film surface after applying the laser beam irradiation for forming the modified regions to the wafer shown in FIG. 14 which had undergone the step of partly removing the dielectric multilayer film. The process conditions employed at this time were the same as the Process Conditions 1 listed above.

FIG. 15 shows that, among the grooves formed in the dielectric multilayer film by laser beam irradiation, the groove extending in the first direction has a rough edge on the right hand side. This is presumed to have been caused by the cracks formed obliquely to the direction normal to the substrate in a cross section perpendicular to the a-axis, and that the laser beam irradiation for partly removing the dielectric multilayer film and the laser beam irradiation for partly removing the dielectric multilayer film are offset to each other when applied along the first direction.

Moreover, in the case of the wafer according to Comparative Example 1, cracks could not be adequately extended from the modified regions to the principal face where the dielectric multilayer film was formed. This is believed to be because the laser beam applied for forming the modified regions was scattered or absorbed by the areas where the dielectric multilayer film had been removed, and thus was not sufficiently focused inside the substrate.

The comparison of the appearance of the respective dielectric multilayer films of the light emitting elements between Comparative Example 1 and Example 1 revealed that the respective light emitting elements of Comparative Example 1 had a greater number of chipping on the periphery of the dielectric multilayer film. It is clear from these results that performing the step of partly removing the dielectric multilayer film following the step of stealth dicing as in the case of Example 1 can reduce the occurrence of chipping of the dielectric multilayer film, thereby enabling attenuation of the decline in the yield.

COMPARATIVE EXAMPLE 2

Light emitting elements of Comparative Example 2 were produced in the same or a similar manner to that in Example 1 except for not performing the step of partly removing the dielectric multilayer film by laser beam irradiation. In other words, in Comparative Example 2, modified regions were formed in the substrate by irradiating and focusing the laser beam in the substrate via the dielectric multilayer film, and the wafer was subsequently divided into multiple light emitting elements without performing laser beam irradiation on the dielectric multilayer film. The process conditions used for forming the modified regions with the laser beam were the same as the Process Conditions 1 described above.

The comparison of the appearance of the respective dielectric multilayer films of the light emitting elements between Comparative Example 2 and Example 1 revealed that each of the light emitting elements in Comparative Example 2 had a greater number of chipping on the periphery of the dielectric multilayer film.

According to an embodiment of the present disclosure, semiconductor light emitting elements, such as LEDs, laser diodes, or the like can be efficiently provided.

What is claimed is:
1. A method of manufacturing a light emitting element, the method comprising:

providing a wafer that includes a substrate having a first principal face and a second principal face, a dielectric multilayer film disposed on the first principal face, and a semiconductor structure disposed on the second principal face;

forming modified regions in the substrate by focusing a laser beam inside the substrate via the dielectric multilayer film, and allowing cracks to form from the modified regions to the dielectric multilayer film;

subsequent to forming the modified regions in the substrate, removing regions of the dielectric multilayer film that contain cracks from the first principal face of the substrate; and cleaving the wafer along regions where cracks were formed in the substrate.

2. The method of manufacturing a light emitting element according to claim 1, wherein:

the substrate is made of sapphire, the second principal face extends in a c-plane of the substrate, and the step of forming modified regions in the substrate comprises:

forming the modified regions along a first direction that is parallel to an a-axis of the substrate by applying laser beam scanning in the first direction, and forming the modified regions along a second direction that is parallel to an m-axis of the substrate by applying laser beam scanning in the second direction.

3. The method of manufacturing a light emitting element according to claim 2, wherein, in the step of removing regions of the dielectric multilayer film, the regions are removed by laser beam irradiation.

4. The method of manufacturing a light emitting element according to claim 2, wherein:

the step of removing regions of the dielectric multilayer film comprises:

removing regions of the dielectric multilayer film that are shifted in the second direction by a predetermined amount from the modified regions that are arranged along the first direction, and removing regions of the dielectric multilayer film immediately above the modified regions that are arranged along the second direction.

5. The method of manufacturing a light emitting element according to claim 3, wherein:

the step of removing regions of the dielectric multilayer film comprises:

removing regions of the dielectric multilayer film that are shifted in the second direction by a predetermined amount from the modified regions that are arranged along the first direction, and removing regions of the dielectric multilayer film immediately above the modified regions that are arranged along the second direction.

6. The method of manufacturing a light emitting element according to claim 3, wherein each of the removed regions of the dielectric multilayer film has a width in a range of from 8 μm to 10 μm.

7. The method of manufacturing a light emitting element according to claim 4, wherein each of the removed regions of the dielectric multilayer film immediately above the modified regions that are arranged along the second direction has a width in a range of from 8 μm to 10 μm.

8. The method of manufacturing a light emitting element according to claim 5, wherein each of the removed regions of the dielectric multilayer film immediately above the modified regions that are arranged along the second direction has a width in a range of from 8 μm to 10 μm.

9. The method of manufacturing a light emitting element according to claim 1, wherein the dielectric multilayer film includes two or more selected from the group consisting of $SiO_2$ film, $TiO_2$ film, and $Nb_2O_5$ film.

10. The method of manufacturing a light emitting element according to claim 2, wherein the dielectric multilayer film includes two or more selected from the group consisting of $SiO_2$ film, $TiO_2$ film, and $Nb_2O_5$ film.

11. The method of manufacturing a light emitting element according to claim 3, wherein the dielectric multilayer film includes two or more selected from the group consisting of $SiO_2$ film, $TiO_2$ film, and $Nb_2O_5$ film.

12. The method of manufacturing a light emitting element according to claim 4, wherein the dielectric multilayer film includes two or more selected from the group consisting of $SiO_2$ film, $TiO_2$ film, and $Nb_2O_5$ film.

13. The method of manufacturing a light emitting element according to claim 1, wherein the dielectric multilayer film has a thickness in a range of from 1 μm to 3 μm.

14. The method of manufacturing a light emitting element according to claim 2, wherein the dielectric multilayer film has a thickness in a range of from 1 μm to 3 μm.

15. The method of manufacturing a light emitting element according to claim 3, wherein the dielectric multilayer film has a thickness in a range of from 1 μm to 3 μm.

16. The method of manufacturing a light emitting element according to claim 9, wherein the dielectric multilayer film has a thickness in a range of from 1 μm to 3 μm.

17. A method of manufacturing a light emitting element, the method comprising:

providing a wafer that includes a substrate having a first principal face and a second principal face, a dielectric multilayer film disposed on the first principal face, and a semiconductor structure disposed on the second principal face;

forming modified regions in the substrate by focusing a laser beam inside the substrate via the dielectric multilayer film, and allowing cracks to form from the modified regions to the dielectric multilayer film;

subsequent to forming the modified regions in the substrate, removing regions of the dielectric multilayer film that contain cracks; and subsequent to removing the regions of the dielectric multilayer film that contain cracks, cleaving the wafer along regions where cracks were formed in the substrate.

18. The method of manufacturing a light emitting element according to claim 17, wherein:

the substrate is made of sapphire, the second principal face extends in a c-plane of the substrate, and the step of forming modified regions in the substrate comprises:

forming the modified regions along a first direction that is parallel to an a-axis of the substrate by applying laser beam scanning in the first direction, and forming the modified regions along a second direction that is parallel to an m-axis of the substrate by applying laser beam scanning in the second direction.

19. The method of manufacturing a light emitting element according to claim 18, wherein, in the step of removing regions of the dielectric multilayer film, the regions are removed by laser beam irradiation.

20. The method of manufacturing a light emitting element according to claim 18, wherein:

the step of removing regions of the dielectric multilayer film comprises:
  removing regions of the dielectric multilayer film that are shifted in the second direction by a predetermined amount from the modified regions that are arranged along the first direction, and
  removing regions of the dielectric multilayer film immediately above the modified regions that are arranged along the second direction.

* * * * *